(12) United States Patent
Hayashi et al.

(10) Patent No.: US 6,213,153 B1
(45) Date of Patent: Apr. 10, 2001

(54) ELECTRIC POWER SUPPLY APPARATUS FOR SOLENOID VALVE MANIFOLD

(75) Inventors: Bunya Hayashi; Shinji Miyazoe; Shinichi Yoshimura, all of Ibaraki (JP)

(73) Assignee: SMC Corporation, Tokyo (JP)

( * ) Notice: Subject to any disclaimer, the term of this patent is extended or adjusted under 35 U.S.C. 154(b) by 0 days.

(21) Appl. No.: 09/594,553

(22) Filed: Jun. 15, 2000

(30) Foreign Application Priority Data

Jul. 19, 1999 (JP) .................................................. 11-205162

(51) Int. Cl.[7] .................................................. F16K 11/10
(52) U.S. Cl. .......................................... 137/884; 137/560
(58) Field of Search ..................................... 137/560, 884

(56) References Cited

U.S. PATENT DOCUMENTS

| | | | |
|---|---|---|---|
| 5,234,033 | * | 8/1993 | Stoll et al. ............................ 137/884 |
| 5,348,047 | * | 9/1994 | Stoll et al. ............................ 137/554 |
| 5,458,048 | * | 10/1995 | Hohner .................................. 91/459 |
| 5,887,623 | * | 3/1999 | Nagai et al. .......................... 137/884 |

* cited by examiner

*Primary Examiner*—John Fox
(74) *Attorney, Agent, or Firm*—Oblon, Spivak, McClelland, Maier & Neustadt, P.C.

(57) ABSTRACT

Simple adaptation to change in the number of terminals in a serial unit or the like is made possible in controlling a plurality of solenoid valves by a solenoid valve manifold. An electric circuit section of a connected manifold block 2 having solenoid valves 1 mounted thereon is constructed by electrically connecting, with a wiring on a printed wiring board 34, a multiple-pole male connector 35 disposed on one connecting surface of the manifold block, a multiple-pole female connector 36 disposed on the other connecting surface, and an electric power supplying connector 37 connected to an electric power receiving connector 14 of the solenoid valves. The wiring on the printed wiring board 34 is constructed in such a manner that terminals of the multiple-pole male connector 35 that send driving signals to respective solenoid valves are connected to terminals of the female connector 36 by shifting the driving signals thereof sequentially to terminals on the electric power supplying connector 37 side; the terminal on the utmost end of the shifted side is connected to the electric power supplying connector 37; and a common terminal 57 is disposed at the end of the aforesaid electric power supplying connector side.

3 Claims, 7 Drawing Sheets

ELECTRIC POWER SUPPLY APPARATUS FOR SOLENOID VALVE MANIFOLD

FIELD OF THE INVENTION

The present invention relates to an electric power supply apparatus for supplying electric power to a solenoid valve manifold in which solenoid valves are mounted on manifold blocks having a fluid passage section and an electric circuit section.

PRIOR ART

In a solenoid valve manifold in which solenoid valves are mounted on mutually connectable manifold blocks having a fluid passage section and an electric circuit section, the plurality of solenoid valves can be controlled with ease in the solenoid valve manifold being mutually connected and having a common construction, by constructing the aforesaid electric circuit section by electrically connecting, with a wiring on a printed wiring board, a multiple-pole male connector disposed on one connecting surface of a manifold block, a multiple-pole female connector disposed on the other connecting surface and joined to said male connector of an adjacent manifold block, and an electric power supplying connector disposed on a valve attachment surface of an upper surface and connected to an electric power receiving connector of the solenoid valves, and by sending a driving signal to each solenoid valve on each manifold block from the multiple-pole male connector on the basis of serial signals transmitted through a serial unit, signals sent through a multiple-pole connector, and the like to control driving of those solenoid valves.

However, in controlling the plurality of solenoid valves in the solenoid valve manifold thus connected, a countermeasure to meet the change in the number of terminals in the serial unit or the multiple-pole connector has not been conventionally taken into account, so that a serial unit and various connectors, printed wiring boards, and others had to be prepared for each case in accordance with the number of terminals, raising a problem in economy and also lacking convenience in use.

SUMMARY OF THE INVENTION

A technical object of the present invention is to provide an electric power supplying apparatus for a solenoid valve manifold that can be easily adapted to change in the number of terminals in a serial unit or in a multiple-pole connector in controlling a plurality of solenoid valves in a plurality of connected solenoid valve manifolds, thereby to improve the problem in economy and at the same time making it convenient for use.

Another technical object of the present invention is to provide an electric power supplying apparatus for a solenoid valve manifold in which an electric power supplying circuit component for supplying electric power to the aforesaid solenoid valves can be easily mounted onto a manifold block.

In order to achieve the aforesaid object, an electric power supplying apparatus for a solenoid valve manifold of the present invention is characterized in that, in a solenoid valve manifold in which mutually connected manifold blocks having solenoid valves mounted on a valve attachment surface of an upper surface for switching passages of compressed fluid include a fluid passage section for feeding and discharging the compressed fluid to said solenoid valves through a common passage and an electric circuit section for supplying a driving electric power to said solenoid valves, said electric circuit section is constructed by electrically connecting, with a wiring on a printed wiring board, a multiple-pole male connector disposed on one connecting surface of a manifold block, a multiple-pole female connector disposed on the other connecting surface and joined to said male connector of an adjacent manifold block, and an electric power supplying connector disposed on the valve attachment surface of the upper surface and connected to an electric power receiving connector of the solenoid valves, and the wiring on said printed wiring board is constructed in such a manner that terminals of the multiple-pole male connector that send driving signals to respective solenoid valves on the connected manifold blocks are connected to terminals of the female connector by shifting the driving signals thereof sequentially to terminals on the electric power supplying connector side, the terminal on the utmost end of the shifted side being connected to the electric power supplying connector, and has a common terminal disposed at the end of said electric power supplying connector side and interconnected between the male connector and the female connector.

In the electric power supplying apparatus of a solenoid valve manifold having the aforesaid construction, in controlling a plurality of solenoid valves with the solenoid valve manifold, the wiring on said printed wiring board is constructed in such a manner that terminals of the multiple-pole male connector are connected to terminals of the female connector by shifting the driving signals for the solenoid valves sequentially to the electric power supplying connector side, the terminal on the utmost end of the shifted side being connected to the electric power supplying connector, and has a common terminal disposed at the end of said electric power supplying connector side and interconnected between the male connector and the female connector, whereby any terminals exceeding the number of required terminals are disposed as spare terminals on the side opposite to the electric power supplying connector. Therefore, even if the number of terminals in a serial unit or a multiple-pole connector is changed, a common printed wiring board can be used in accordance therewith, and the number of poles in various connectors can also be allowed to have a degree of freedom.

In the aforesaid electric power supplying apparatus for the solenoid valve manifold, it is effective in simplifying the mounting of the electric power supplying circuit component onto the manifold block if the electric circuit section of the manifold block includes a housing chamber that is open to both connecting surface sides thereof and capable of housing said electric power supplying circuit component having the male connector, the female connector, and the electric power supplying connector connected to the printed wiring board, and said housing chamber includes a seating section on which the printed wiring board is seated when said electric power supplying connector moves upward to a position of being confronted with a connector-joining hole of the upper surface in the manifold block, and a holding means is provided for holding said electric power supplying circuit component at an upwardly moved position where it is seated, and said holding means for holding the electric power supplying circuit component includes a holder being inserted under the electric power supplying circuit component housed at a predetermined position in the housing chamber from an opening of a connecting surface of the manifold block and holding said electric power supplying circuit component upwards, and a stopping section is disposed between the holder and an inner surface of the housing chamber for stopping the holder at its inserted position by engaging in a freely engageable and disengageable manner.

DETAILED DESCRIPTION OF THE PREFERRED EMBODIMENTS

Figure 1:
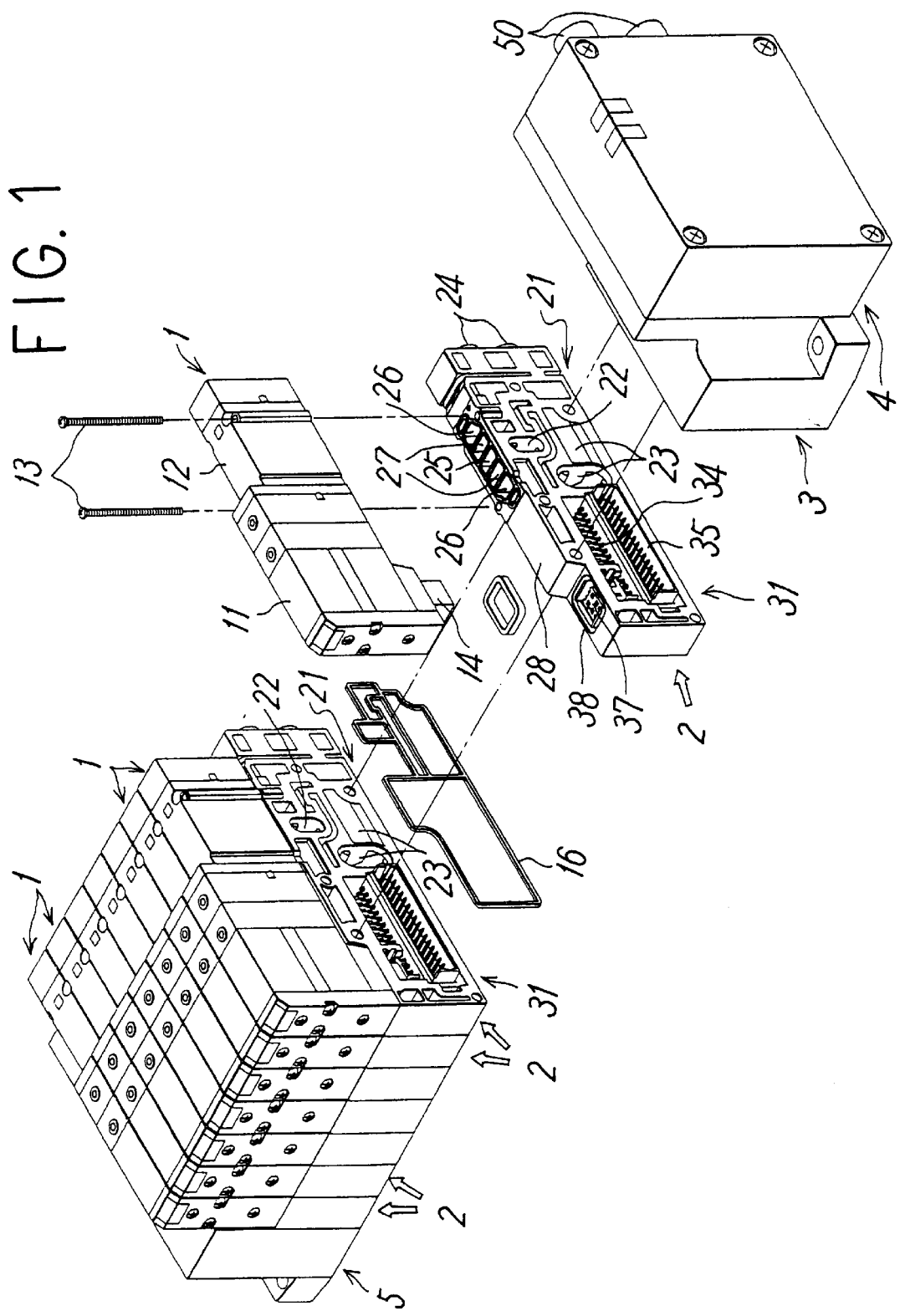
FIG. 1 is an exploded perspective view of a manifold-type solenoid valve constructed with a solenoid valve manifold including an electric power supplying apparatus according to the present invention.

FIG. 1 shows an embodiment of a manifold-type solenoid valve assembly constructed by connecting a plurality of solenoid valve manifolds having an electric power supplying apparatus according to the present invention.

This manifold-type solenoid valve assembly schematically includes a plurality of solenoid valves 1 for switching passages of compressed fluid, a plurality of connected manifold blocks 2 individually having these solenoid valves 1 mounted thereon, a feeding and discharging block 3 connected to one end of a series of these manifold blocks 2 for feeding and discharging the compressed fluid through common passages 22, 23 located within these manifold blocks 2, a serial unit 4 for controlling the operation of the solenoid valves 1 as a whole, and an end block 5 connected to the other end of the connected manifold blocks 2.

The aforesaid solenoid valve 1 includes a single or a plurality of solenoids 58 (See FIG. 4) therein, and is adapted to drive a 3-port or 5-port main valve 12 through a pilot valve 11 electromagnetically driven by these solenoids or directly by these solenoids thereby to switch the feeding and discharging at the aforesaid main valve. The aforesaid solenoid valves 1 are fixed and mounted on a valve attachment surface 28 of an upper surface of the aforesaid manifold block 2 by means of attachment screws 13.

Further, an electric power receiving connector 14 electrically connected to an electric power supplying connector 37 on the valve attachment surface 28 of said manifold block 2 is disposed on an attachment surface to the manifold block 2 located on a lower surface of the solenoid valve 1.

Here, the aforesaid solenoid valve 1, whether it is a 3-port or 5-port one, is constructed to have the same outer shape with the only difference being in an internal mechanism, because common manifold blocks 2 are used.

Figure 2:
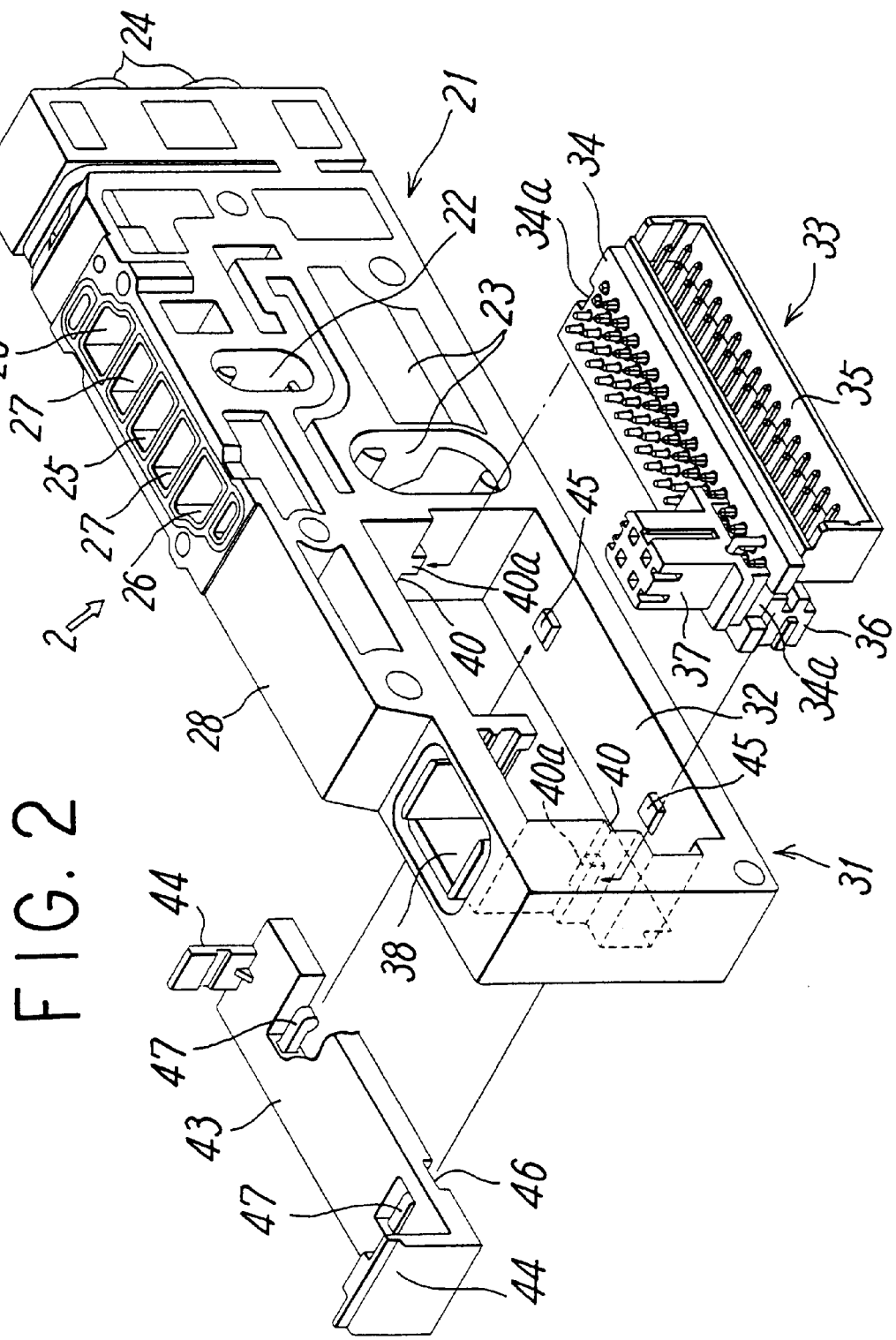
FIG. 2 is an exploded perspective view exemplifying a construction of the aforesaid solenoid valve manifold.

As will be understood from FIGS. 1 and 2, the aforesaid manifold block 2 includes a fluid passage section 21 for feeding and discharging the compressed fluid to the aforesaid solenoid valve 1, and an electric circuit section 31 for supplying a driving electric power to said solenoid valve 1. Like a known manifold block, the aforesaid fluid passage section 21 includes a common feeding passage 22 and two common discharging passages 23, 23 that are in mutual communication with passages (not illustrated) located in the feeding and discharging block 3 penetrating each manifold block 2, and output passages for feeding and discharging the output fluid from the solenoid valves to two outlets 24, 24 that are open on one end surface of the manifold block 2. These common passages and output passages are in communication with the feeding passage 25, the discharging passage 26 and the output passage 27 located on the valve attachment surface 28 of the upper surface. These passages are in communication with openings disposed on the attachment surface to the manifold block 2 in the solenoid valve 1.

Further, the aforesaid electric circuit section 31 is constructed by housing an electric power supplying circuit component 33 in a housing chamber 32 which is located in the manifold block 2 and open to both connecting surface sides. This electric power supplying circuit component 33 is constructed in such a manner that a multiple-pole male connector 35 to which driving signals based on a serial signal for controlling driving of the solenoid valve 1 is sent, a multiple-pole female connector 36 connected to the male connector 35 of an adjacent manifold block 2, and an electric power supplying connector 37 for supplying a driving electric power for switching the main valve 12 to the solenoid valve 1 are connected to a printed wiring board 34. These are electrically interconnected with a printed wiring on the printed wiring board 34 and are connected so that the driving signal from the male connector 35 is sent to a driving system of the solenoid valve 1 through the electric power supplying connector 37, and they are further sent from the female connector 36 to the male connector 35 of an adjacent manifold block 2.

The aforesaid electric power supplying circuit component 33 is constructed in such a manner that, when it is housed at a predetermined position in the housing chamber 32, the male connector 35 is disposed on one connecting surface of the manifold block 2 and the female connector 36 is disposed on the other connecting surface of the manifold block 2 at a position of being joined with the aforesaid male connector 35 at the time of connection with an adjacent manifold block 2. Further, the aforesaid electric power supplying connector 37 is disposed at a position of being confronted with a connector-joining hole 38 formed to be open on the upper surface of the manifold block 2.

In order to house this electric power supplying circuit component 33 at a predetermined position within the housing chamber 32 of the manifold block 2, the housing chamber 32 is open to both connecting surface sides of the manifold block 2 to be capable of housing the aforesaid electric power supplying circuit component 33 in which the male connector 35, the female connector 36, and the electric power supplying connector 37 are connected to the printed wiring board 34. Further, this housing chamber 32 includes a pair of seating sections 40 on which the printed wiring board 34 is seated. The pair of these seating sections 40 serve to seat both ends of the printed wiring board 34 when the electric power supplying connector 37 of the electric power supplying circuit component 33 inserted into the housing chamber 32 is moved upwards to a position of being confronted with the connector-joining hole 38 located on the upper surface of the manifold block 2. Said seating sections 40 include projections 40a that mutually engage with recesses 34a disposed respectively on both ends of the printed wiring board 34, and these engaging sections serve to stabilize the seating of the printed wiring board 34.

Further, as a holding means for holding the electric power supplying circuit component 33 housed within the housing chamber 32, the aforesaid electric circuit section 31 includes a holder 43 that pushes the printed wiring board 34 upwards to hold it in a state of being seated at the seating section 40. This holder 43 is inserted under the aforesaid electric power supplying circuit component 33 in the housing chamber 32 through an opening of a connecting surface of the manifold block 2, and supports the printed wiring board 34 upwards by supporting sections 44 disposed to stand on both sides thereof so that said electric power supplying circuit component 33 can be stably supported upwards by engaging the holder 43 itself with an inner surface of the housing chamber 32 at a stopping section in a freely engageable and disengageable manner. For this purpose, a pair of stopping projections 45 are disposed to protrude on an inside bottom of the housing chamber 32 and, on the other hand, relieving grooves 46 that pass the stopping projections 45 therethrough and engaging claws (pawls) 47 that engage with the stopping projections 45 are disposed in the holder 43. The engaging claws 47 of the holder 43 are adapted to release the engagement through the aforesaid relieving grooves 46.

The aforesaid feeding and discharging block 3 includes a feeding joint and a discharging joint (not illustrated) on one end surface thereof, and they are allowed to be in communication with the common feeding passage 22 and the common discharging passages 23, 23 that penetrate each manifold block 2 so as to supply a fed fluid from outside to the common feeding passage 22 and to discharge the exhaust fluid from each solenoid valve 1 through the common discharging passages 23, 23.

Further, a serial unit 4 mounted on the feeding and discharging block 3 is adapted to receive and relay serial signals transmitted from a controlling system through a transmitting/receiving terminal 50 disposed on one end surface thereof and to receive driving electric power from an electric power supply unit, thereby to send driving signals to the manifold block 2 and to transmit the serial signals and supply the driving electric power to a controlling device of the next order such as a manifold-type solenoid valve.

Here, the aforesaid transmitting/receiving terminal 50 may or may not include a supply line for the driving electric power. If it does not include a supply line, it is necessary to supply the driving electric power by a separate means.

Figure 3:
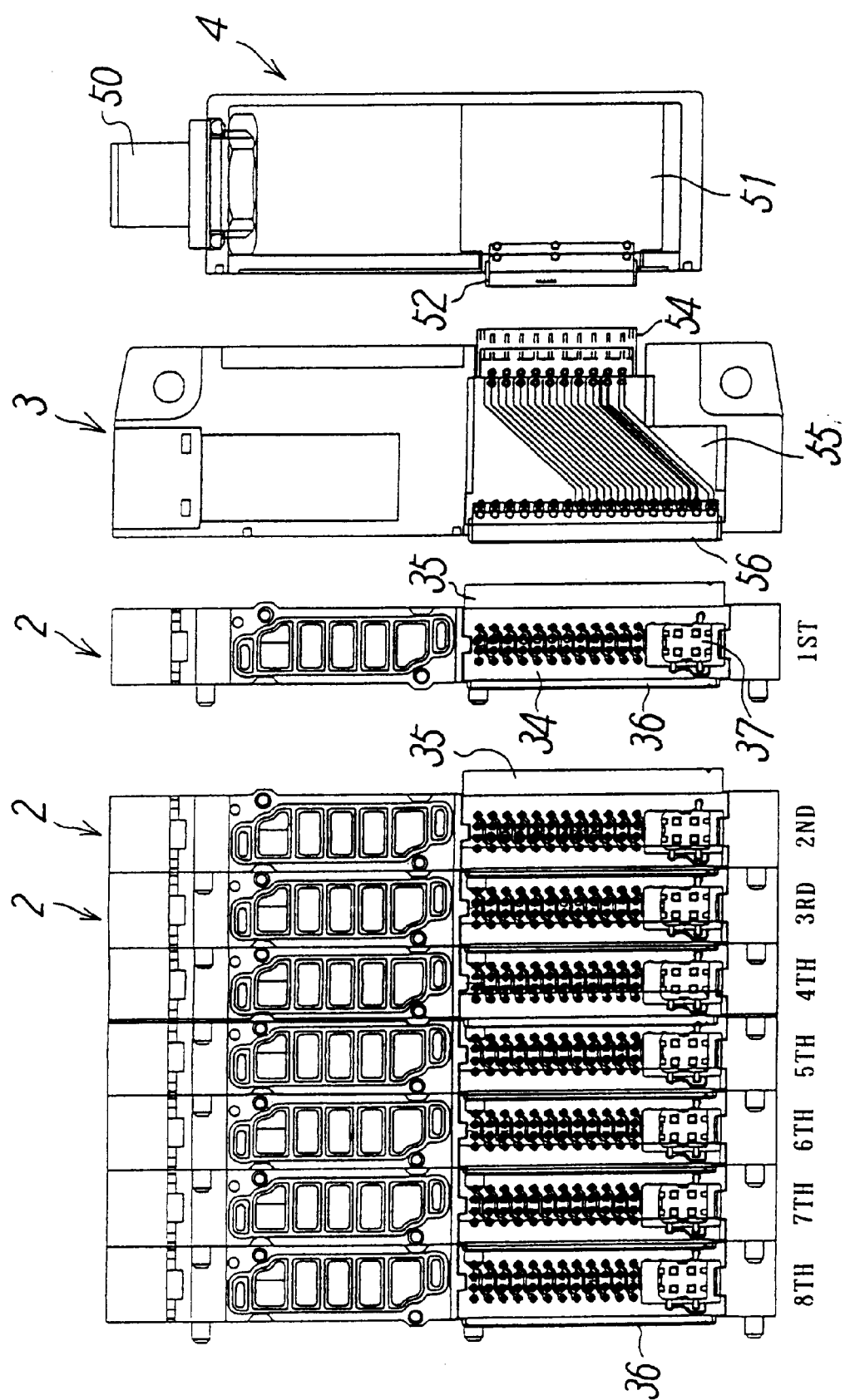
FIG. 3 is an explanatory view showing a manner of electrical connection in the aforesaid manifold-type solenoid valve.
Figure 4:
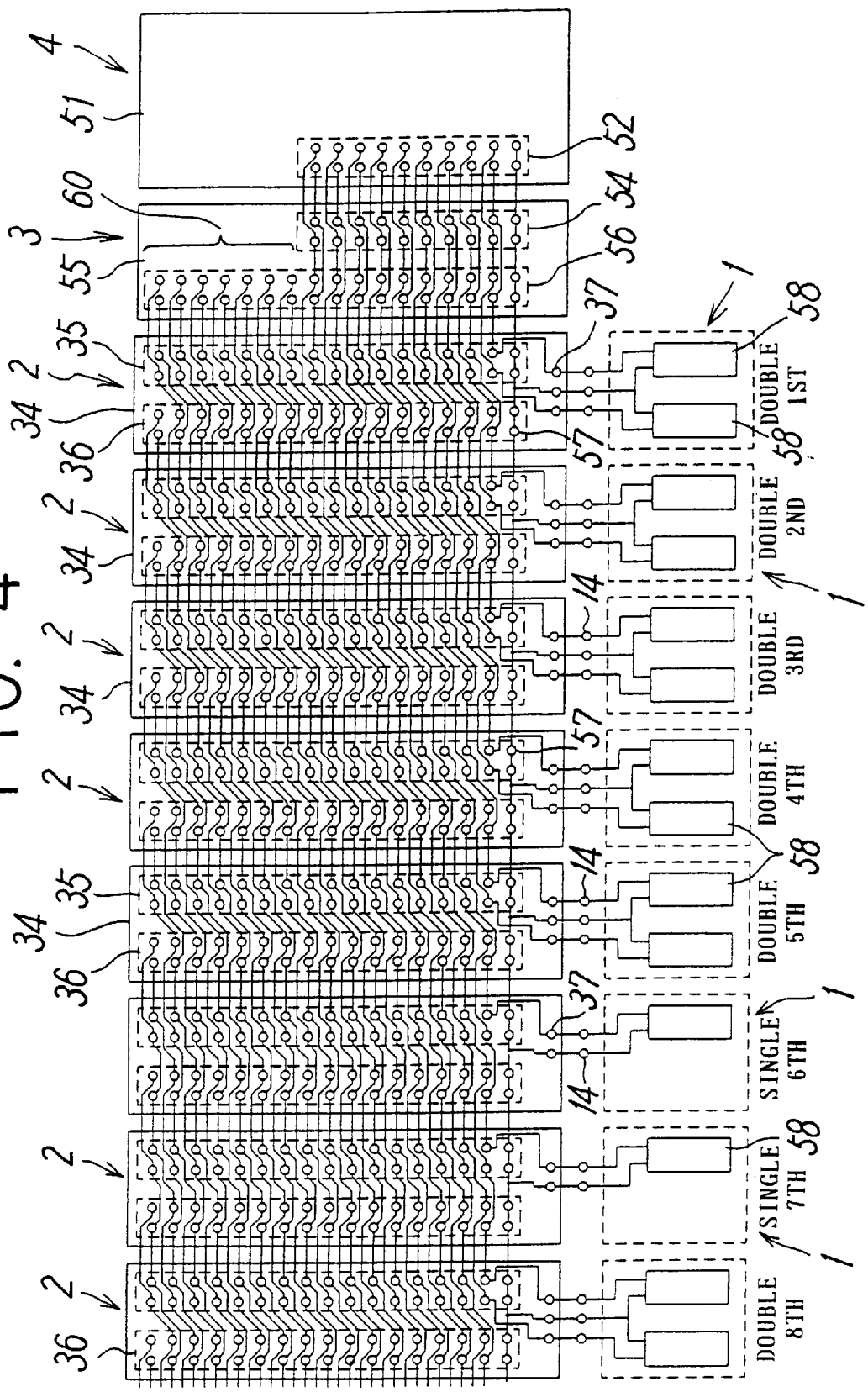
FIG. 4 is a circuit construction view showing a manner of electrical connection in the aforesaid manifold-type solenoid valve.

As will be understood from FIGS. 3 and 4, transmission of the driving signal to each manifold block 2 by the aforesaid serial unit 4 is carried out from a female connector 52 disposed on a printed wiring board 51 of the serial unit 4 through a male connector 54 and a female connector 56 disposed on a printed wiring board 55 of a feeding and discharging block 3. A male connector 35 disposed on a printed wiring board 34 of the manifold block 2 is connected to this female connector 56 and, thereafter, the male connector 35 of a printed wiring board 34 of the next stage is connected to the female connector 36 disposed on the printed wiring board 34 of each manifold block 2, whereby the driving signal is successively transmitted to each manifold block 2.

The wiring on the printed wiring board 34 of each manifold block 2 is constructed in such a manner that terminals of the multiple-pole male connector 35 that send driving signals to respective solenoid valves 1 on the connected manifold blocks 2 are connected to terminals of the female connector 36 by shifting the driving signals thereof sequentially to the electric power supplying connector 37 side in accordance with the number of solenoids 58 in the solenoid valve 1; the terminal on the utmost end of the shifted side is connected to the electric power supplying connector 37; and a common terminal 57 interconnected between male connectors and female connectors is disposed at the end of the aforesaid electric power supplying connector 37 side. The aforesaid terminal on the utmost end of the electric power supplying connector 37 side and the common terminal 57 are connected to the solenoid 58 of the solenoid valve 1.

Further, the aforesaid end block 5 is located on the other end of the connected manifold blocks 2, and is adapted to sandwich and join the manifold blocks 2 in a sealed state between the feeding and discharging block 3 and the end block 5 each through a gasket 16. This end block 5 closes the end portions of the common passages 22, 23 and others disposed to penetrate the manifold blocks 2. A circuit section for receiving the driving signals transmitted through the electric power supplying circuit component 33 of each manifold block 2 can be disposed in this end block 5.

In the solenoid valve manifold having the aforesaid construction, the serial signals from the controlling system and the driving electric power from the power supply unit are transmitted and supplied to the serial unit 4, and the driving signals based on these serial signals and others are sent from the serial unit 4 to respective solenoid valves 1 mounted on the manifold block 2 through the printed wiring board 55 of the feeding and discharging block 3, whereby each solenoid valve 1 is driven on the basis of the serial signal.

At this time, in a circuit embodiment shown in FIG. 4, supposing that the female connector 52 for supplying electric power from the serial unit 4 to the manifold blocks 2 through the printed wiring board 55 of the feeding and discharging block 3 has, for embodiment, 20 poles, the male connector 54 having 20 poles may be converted to the female connector 56 having 34 poles in the printed wiring board 55, so as to connect between the female connector 56 and the printed wiring board 34 within the manifold block 2 and between printed wiring boards 34 by means of the female and male connectors having 34 poles. In this case, although the terminals of 14 poles on the side opposite to the electric power supplying connector 37 are connected by the connectors, they serve as spare terminals 60 and are left in an electrically unused state.

Alternatively, the female connector 56 in the feeding and discharging block 3 may be allowed to have 20 poles; the printed wiring board 34 in the manifold blocks 2 may be allowed to have still 34 poles; the male connector 35 and the female connector 36 disposed on the printed wiring board may be allowed to have 20 poles; and these may be connected by a connector having 20 poles. In this case, the spare terminals of the printed wiring board 34 are not connected to the female and male connectors; however, the printed wiring board can be used in common with those having 34 poles. This is realized by the fact the common terminal 57 is disposed at the end on the electric power supplying connector 37 side and the spare terminals 60 are disposed on the other side opposite thereto.

Thus, in controlling a plurality of solenoid valves by means of a solenoid valve manifold, if the wiring on the aforesaid printed wiring board 34 is constructed in such a manner that terminals of the multiple-pole male connector 35 are connected to terminals of the female connector 36 by shifting the driving signals for the solenoid valves 1 sequentially to the electric power supplying connector 37 side, the terminal on the utmost end of the shifted side is connected to the electric power supplying connector 37, and a common terminal 57 is disposed at the end of the aforesaid electric power supplying connector 37 side, then any terminals exceeding the required number of terminals are disposed as spare terminals 60 on the side opposite to the electric power supplying connector 37. This allows that, if the number of terminals in the serial unit 4 is changed, a common printed wiring board 34 can be used in accordance therewith, and also the apparatus can be allowed to have a degree of freedom in the number of poles in various connectors.

Figure 5:
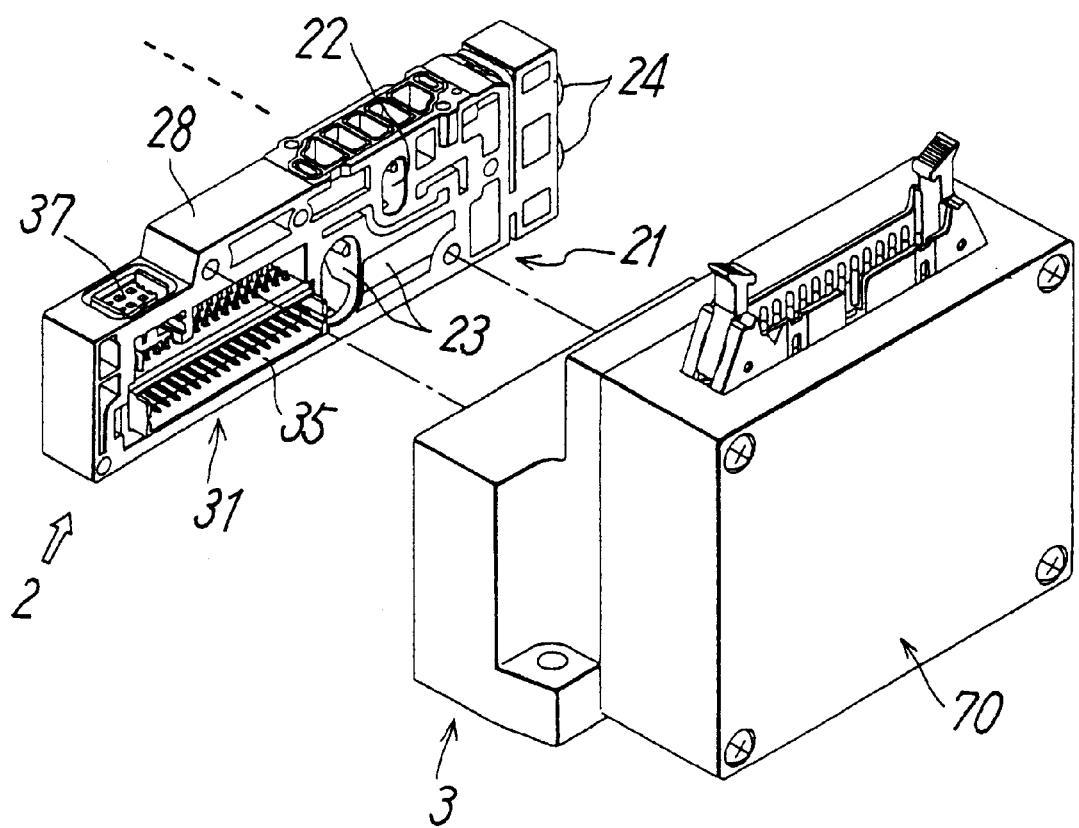
FIG. 5 is an exploded perspective view of a portion showing another construction embodiment of a manifold-type solenoid valve constructed with a solenoid valve manifold including an electric power supplying apparatus according to the present invention.
Figure 6:
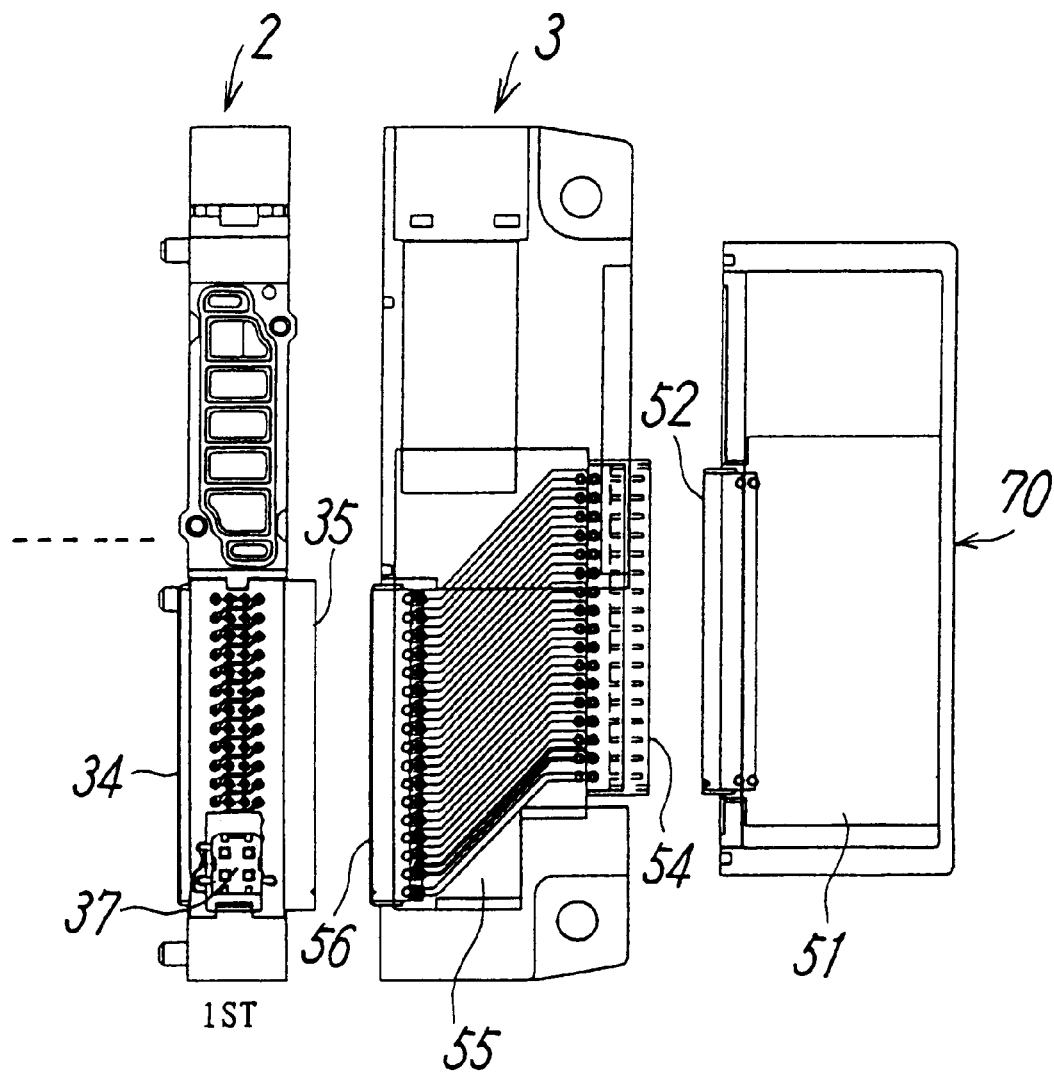
FIG. 6 is an explanatory view of an essential portion showing a manner of electrical connection in the manifold-type solenoid valve of FIG. 5.
Figure 7:
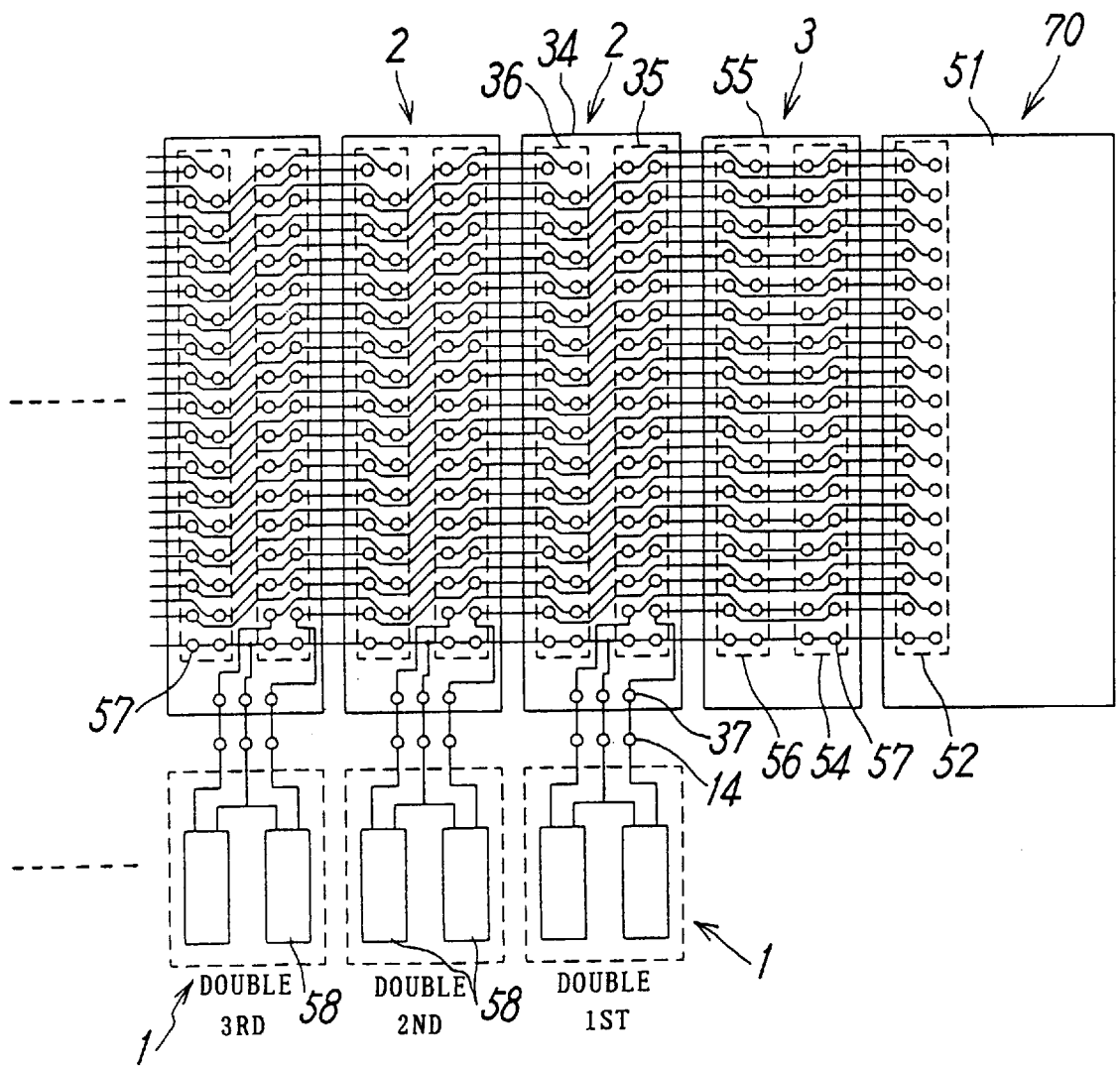
FIG. 7 is a partial circuit construction view showing a manner of electrical connection in the manifold-type solenoid valve of FIG. 5.

An embodiment shown in FIGS. 5 to 7 shows a case in which a multiple-pole connector 70 is used in place of the serial unit 4 of the previously described Embodiment. In this Embodiment, the multiple-pole connector 70 has 34 poles and, in accordance therewith, the connectors in the feeding and discharging block 3 and in the manifold block 2 have 34 poles for connection. However, since this Embodiment is substantially the same as the previously described Embodiment except that the driving signals for driving the solenoid valves are transmitted from the controlling system through the multiple-pole connector 70, explanation thereof will be omitted by denoting principal corresponding parts with same reference numerals.

According to the electric power supplying apparatus for a solenoid valve manifold of the present invention thus described in detail, the apparatus can be easily adapted to the change in the number of terminals in the serial unit or in the multiple-pole connector in controlling a plurality of solenoid valves by means of the solenoid valve manifold, whereby it is possible to obtain an electric power supplying apparatus for a solenoid valve manifold that improves the economic problems and is at the same time convenient for use.

In addition, according to the present invention, electric power supplying circuit components for supplying electric power to the solenoid valves can be mounted onto the manifold block in an extremely simple manner.

What is claimed is:

1. An electric power supplying apparatus for a solenoid valve manifold characterized in that, in a solenoid valve manifold in which mutually connected manifold blocks having solenoid valves mounted on a valve attachment surface of an upper surface for switching passages of compressed fluid include a fluid passage section for feeding and discharging the compressed fluid to said solenoid valves through a common passage and an electric circuit section for supplying a driving electric power to said solenoid valves, said electric circuit section is constructed by electrically connecting, with a wiring on a printed wiring board, a multiple-pole male connector disposed on one connecting surface of a manifold block, a multiple-pole female connector disposed on the other connecting surface and joined to said male connector of an adjacent manifold block, and an electric power supplying connector disposed on the valve attachment surface of the upper surface and connected to an electric power receiving connector of the solenoid valves, and the wiring on said printed wiring board is constructed in such a manner that terminals of the multiple-pole male connector that send driving signals to respective solenoid valves on the connected manifold blocks are connected to terminals of the female connector by shifting the driving signals thereof sequentially to terminals on the electric power supplying connector side, the terminal on the utmost end of the shifted side being connected to the electric power supplying connector, and has a common terminal disposed at the end of said electric power supplying connector side and interconnected between the male connector and the female connector.

2. An electric power supplying apparatus for a solenoid valve manifold as set forth in claim 1, characterized in that;

the electric circuit section of the manifold block includes a housing chamber that is open to both connecting surface sides thereof and capable of housing said electric power supplying circuit component having the male connector, the female connector, and the electric power supplying connector connected to the printed wiring board, and said housing chamber includes a seating section on which the printed wiring board is seated when said electric power supplying connector moves upward to a position of being confronted with a connector-joining hole of the upper surface in the manifold block, and a holding means is provided for holding said electric power supplying circuit component at an upwardly moved position where it is seated.

3. An electric power supplying apparatus for a solenoid valve manifold as set forth in claim 2, characterized in that;

the means for holding the electric power supplying circuit component includes a holder being inserted under the electric power supplying circuit component housed at a predetermined position in the housing chamber from an opening of a connecting surface of the manifold block and holding said electric power supplying circuit component upwards, and a stopping section is disposed between the holder and an inner surface of the housing chamber for stopping the holder at its inserted position by engaging in a freely engageable and disengageable manner.

* * * * *